(12) United States Patent
Nguyen et al.

(10) Patent No.: US 7,079,063 B1
(45) Date of Patent: Jul. 18, 2006

(54) SYSTEM AND METHOD FOR TRI-LEVEL LOGIC DATA SHUFFLING FOR OVERSAMPLING DATA CONVERSION

(75) Inventors: Khiem Quang Nguyen, Tewksbury, MA (US); Richard Schreier, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/108,443

(22) Filed: Apr. 18, 2005

(51) Int. Cl.
*H03M 1/66* (2006.01)

(52) U.S. Cl. ..................................... 341/144; 341/145

(58) Field of Classification Search ................ 341/144, 341/145
See application file for complete search history.

(56) References Cited

U.S. PATENT DOCUMENTS

| | | | |
|---|---|---|---|
| 5,404,142 A * | 4/1995 | Adams et al. ............... | 341/144 |
| 6,414,615 B1 | 7/2002 | Cheng | |
| 6,614,377 B1 * | 9/2003 | Adams et al. ............... | 341/144 |
| 6,711,546 B1 * | 3/2004 | Thomas ...................... | 704/500 |

OTHER PUBLICATIONS

Analog Product Data Literature for AD1955, Analog Devices, Inc., 2002, Norwood, MA., no month.
Analog Product Data Literature for AD1958, Analog Devices, Inc., 2001, Norwood, MA., no month.
Analog Product Data Literature for AD1959, Analog Devices, Inc., 2001, Norwood, MA., no month.
Analog Product Data Literature for AD1836, Analog Devices, Inc., 2001, Norwood, MA., no month.
Analog Product Data Literature for AD1852, Analog Devices, Inc., 2000, Norwood, MA., no month.
Analog Product Data Literature for AD1853, Analog Devices, Inc., 1999, Norwood, MA., no month.
Analog Product Data Literature for AD1855, Analog Devices, Inc., 2000, Norwood, MA., no month.
Analog Product Data Literature for AD1854, Analog Devices, Inc., 2000, Norwood, MA., no month.

* cited by examiner

*Primary Examiner*—Rexford Barnie
*Assistant Examiner*—Joseph Lauture
(74) *Attorney, Agent, or Firm*—Gauthier & Connors LLP

(57) ABSTRACT

A system is disclosed for processing digital signals in a data converter. The system includes a thermometer encoder for receiving signed binary data and for providing signed thermometer data. The signed thermometer data includes positive thermometer data and negative thermometer data. The system also includes a shuffler that receives positive input data responsive to the positive thermometer data and receives negative input data responsive to the negative thermometer data. The system also includes a decoder for receiving output data from the shuffler and providing decoded data to an analog output stage.

14 Claims, 12 Drawing Sheets

FIG. 5

| INPUTS | | | | | | OUTPUTS | | | |
|---|---|---|---|---|---|---|---|---|---|
| a_in_pos | b_in_pos | a_in_neg | b_in_neg | current state a | current state b | swap_pos | swap_neg | next state a | next state b |
| 0 | 0 | 0 | 0 | 0 | 0 | 0 | 0 | 0 | 0 |
| 0 | 0 | 0 | 0 | 0 | 1 | 0 | 0 | 0 | 1 |
| 0 | 0 | 0 | 1 | 1 | 0 | 0 | 0 | 1 | 0 |
| 0 | 0 | 0 | 1 | 0 | 1 | 0 | 0 | 0 | 1 |
| 0 | 0 | 0 | 1 | 0 | 0 | 1 | 1 | 0 | 1 |
| 0 | 0 | 1 | 0 | 0 | 1 | 0 | 1 | 0 | 0 |
| 0 | 0 | 1 | 0 | 1 | 0 | 1 | 1 | 1 | 0 |
| 0 | 0 | 1 | 1 | 0 | 1 | 0 | 1 | 0 | 1 |
| 0 | 0 | 1 | 1 | 1 | 0 | 0 | 0 | 1 | 0 |
| 0 | 0 | 0 | 0 | 0 | 0 | 0 | 0 | 0 | 1 |
| 0 | 0 | 0 | 0 | 1 | 1 | 0 | 0 | 1 | 1 |
| 0 | 0 | 0 | 0 | 0 | 1 | 0 | 0 | 0 | 0 |
| 1 | 0 | 0 | 0 | 1 | 0 | 1 | 0 | 1 | 1 |
| 1 | 0 | 0 | 0 | 0 | 1 | 1 | 0 | 1 | 1 |
| 0 | 1 | 0 | 0 | 1 | 0 | 1 | 0 | 0 | 0 |
| 0 | 1 | 0 | 0 | 0 | 1 | 1 | 0 | 0 | 0 |
| 1 | 1 | 0 | 0 | 0 | 1 | 1 | 1 | 1 | 1 |

SYSTEM AND METHOD FOR TRI-LEVEL LOGIC DATA SHUFFLING FOR OVERSAMPLING DATA CONVERSION

BACKGROUND OF THE INVENTION

The invention generally relates to mixed-signal converters of the sigma-delta noise shaping type, and more particularly, to mixed-signal digital-to-analog converters that employ uniformly weighted elements.

Sigma-delta digital-to-analog converters (DACs) provide for a means to achieve high resolution and low distortion at a relatively low cost compared to traditional Nyquist converters. In a typical multi-bit noise-shaped oversampling DAC, the digital input is first up-sampled by the oversampling ratio (OSR) and filtered to suppress the out-of-band images. A sigma-delta modulator is then used to reduce the word-width to a manageable size, and at the same time, shape the in-band noise to a higher frequency region. A binary to thermometer encoder is used to convert the binary data into thermometer-code data. For example, U.S. Pat. No. 5,404,142 discloses a data-directed scrambling technique in which a quantized noise-shaped word is first converted to a thermometer code. A data-directed shuffler is then used to dynamically select a group of elements of the output stage. The number of elements selected is equal to the number of active thermometer codes. An analog output stage then converts the output of the shuffler into an analog quantity by turning on the selected group of elements according to the decision of the shuffler.

A prior art thermometer-code DAC includes a current steering section and an I-to-V converter that includes a DAC cell driver that controls the BIT and $\overline{\text{BIT}}$ (or BITB) signals. By designing the cross point of the BIT and BITB signals to be one $V_{gs}$ above the common-mode voltage, the inter-symbol interference (ISI) in the DAC cell output waveform will be minimized. $V_{gs}$ is defined to be the gate-to-source voltage of the DAC switches when each is conducting half of the output current.

Due to imperfection of real devices, the current cells will not match exactly. This mismatch problem results in harmonic distortion and noise in the reconstructed analog signal. The performance of the converter is thus limited by the matching of these elements. Commercially available silicon processes can only offer matching of up to 12 bits without calibration or trimming.

This element mismatch has been well studied and methods have been proposed to convert the mismatch error into spectrally shaped noise. By shaping the mismatch error into out-of-band frequency region, the signal-to-noise ratio (SNR) and dynamic range (DNR) of the converter is greatly improved. In these methods, a shuffler (also sometimes called scrambler) is used to dynamically select a group of elements for every digital input code such that over time, each element is equally used. This implies that the first integral of the difference between every pair of elements is zero, hence, equivalent to a first-order noise shaped sigma-delta converters. The only difference is in a normal sigma-delta converter, the amplitude error is noise shaped whereas in a data shuffler, the error in the usage of the element is noise shaped. An example of a prior art butterfly-style shuffler is disclosed in U.S. Pat. No. 6,614,377. A drawback, however, of conventional thermometer-code current steering DACs is thermal noise performance. In particular, when the data is zero, half the number of the switching current sources are connected to one summing junction, and the other half are connected to the other summing junction of the I-to-V converter. Moreover, the top current sources are always connected to the summing junctions. The current sources are the dominant noise source in the DAC output and dictate the SNR of the converter.

Another conventional DAC architecture that does not suffer from the mentioned noise problem includes tri-level logic thermometer current steering DAC that includes a pair of current sources (positive and negative) for each of the bits 0 to 15. Since each pair of current sources can be connected to the summing junction in three different ways, each pair may contribute a positive, a negative quantity of charge or nothing at all. When the data is zero, all the current sources are connected to a buffer amplifier to maintain their proper drain voltage. Therefore, the main noise source of the converter is now from the I-to-V amplifier, which by design, is much smaller than that of the current sources. Hence, the SNR is significantly improved. A difficulty with this architecture, however, is that it again may result in the element mismatch discussed above. Prior art element shufflers do not work with this architecture since they can only shuffle "1" and "0".

There is a need, therefore, for an improved sigma-delta noise-shaping DAC that further reduces element mismatch.

SUMMARY

In accordance with an embodiment, the invention provides a system is disclosed for processing digital signals in a data converter. The system includes a thermometer encoder for receiving signed binary data and for providing signed thermometer data. The signed thermometer data includes positive thermometer data and negative thermometer data. The system also includes a shuffler that receives positive input data responsive to the positive thermometer data and receives negative input data responsive to the negative thermometer data. The system also includes a decoder for receiving output data from the shuffler and providing decoded data to an analog output stage.

In accordance with another embodiment, the invention provides a system for processing digital signals in a data converter that includes a thermometer encoder, a shuffler, and a decoder. The thermometer encoder is for receiving signed binary data and for providing signed thermometer data. The shuffler receives the signed thermometer data and provides tri-level logic output including positive state output, negative state output and zero state output. The decoder is for receiving output data from the shuffler and providing decoded data to an analog output stage.

In accordance with a further embodiment, the invention provides a method of processing digital signals in a data converter that includes the steps of receiving signed binary data at a thermometer encoder; providing signed thermometer data, receiving the signed thermometer data at a shuffler, providing tri-level logic output including positive state output, negative state output and zero state output; receiving output data from the shuffler at a decoder, and providing decoded data to an analog output stage.

BRIEF DESCRIPTION OF THE DRAWINGS

The following description may be further understood with reference to the accompanying drawings in which:

FIG. 5 shows an illustrative truth table for a shuffling cell in accordance with an embodiment of the invention;

The drawings are shown for illustrative purposes only.

DETAILED DESCRIPTION OF THE ILLUSTRATED EMBODIMENTS

The invention provides a shuffler that can handle "+1", "0" and "−1", or tri-level logic data, and in particular provides a DAC cell driver that can generate three signals driving the BIT, BITB and the ZERO in such a way that the ISI in the output waveform is minimized.

Figure 1:
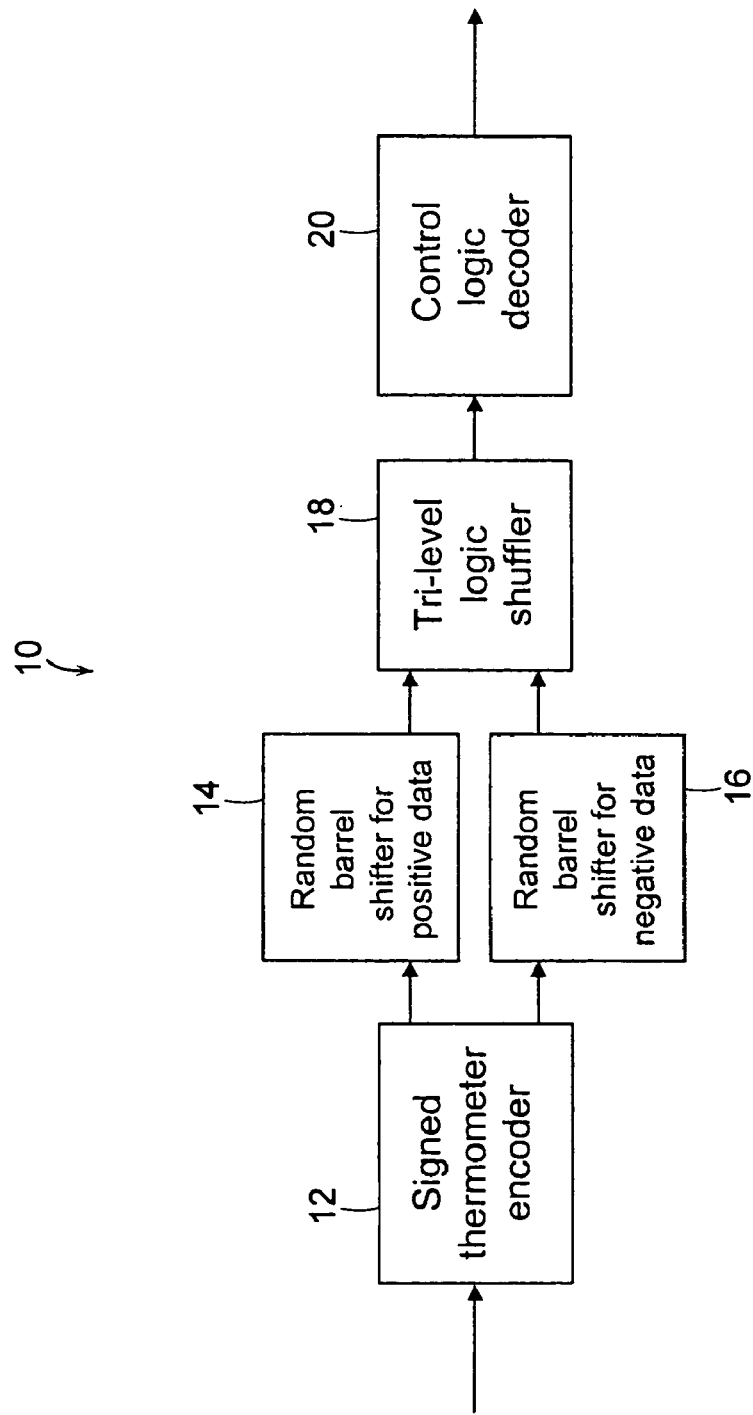
FIG. 1 shows a diagrammatic illustrative view of a functional block diagram of a system in accordance with an embodiment of the invention.

The present invention provides for a tri-level logic thermometer (or signed thermometer) encoder, a shuffler, a control logic decoder, and a DAC cell driver. The function of the tri-level logic thermometer encoder is to encode signed binary data into signed thermometer code. The function of the control logic decoder is to decode the output of the shuffler into control signals for the output stage. The function of the shuffler is to shape the mismatch error into an out-of-band frequency region. FIG. 1 shows the block diagram of a system 10 in accordance with an embodiment of the present invention.

As shown in FIG. 1, signed binary data is received by a signed binary thermometer encoder 12 that provides signed thermometer data to both a random barrel shifter for positive data 14, and a random barrel shifter for negative data 16. The output of each of the random barrel shifters 14 and 16 is provided to a tri-level logic shuffler 18, and the signed shuffled thermometer data that is output by the shuffler 18 is provided to a control logic decoder 20, which provides control signals to the DAC.

The mismatch error of an element $u_i$ is defined as the difference between the actual value of element and the average value of all the elements. Specifically, for an N-element thermometer DAC, the error of element $u_i$ is:

$$e_i = u_i - \frac{1}{N}\sum_{k=0}^{N-1} u_k$$

Each time when the data is "+1" and the element $u_i$ is selected, the error contributed to the output is $+e_i$. Each time when the data is "−1" and the element $u_i$ is selected, the error contributed to the output is $-e_i$. When the data is zero, the error contributed by element $u_i$ during that particular clock cycle is zero.

The shuffler has two functions. First it selects the elements so that the average contribution of the error of each element is zero. Second, the average usage of each element compared to all other elements is kept equal. The first function is achieved by the a shuffler cell in accordance with an embodiment of the present invention while the second function is achieved by the butterfly connection in the overall shuffler. By shuffling the usage of the elements in a data-directed manner, the mismatch error is converted to noise and shaped to out-of-band frequency region.

Figure 2C:
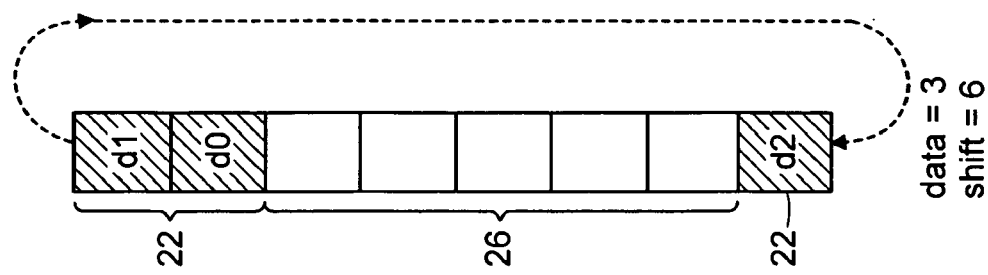
FIGS. 2A–2C show diagrammatic illustrative functional depictions of 3-bit barrel shifters in accordance with an embodiment of the invention.
Figure 2B:
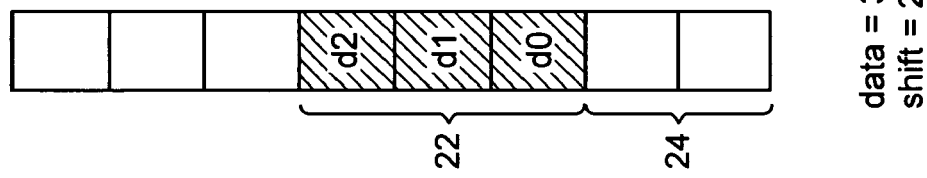
Figure 2A:
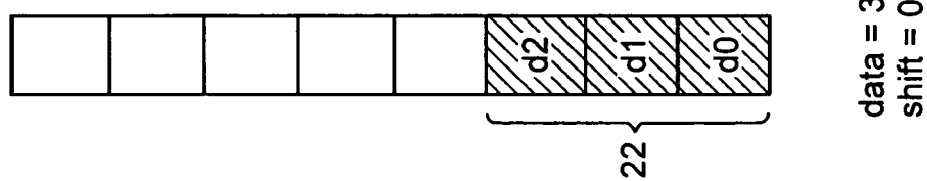

The present invention also provides for two barrel shifters that are controlled by a random number generator. These barrel shifters act to de-correlate the digital input signal of the shuffler so that idle tones are not generated by the shuffler cells. FIGS. 2A, 2B and 2C show the operation of a 3-bit random barrel shifter when the data is 3 and the shift is 0, 2 and 6 respectively. For example, in FIG. 2A the data is a code of 3 as shown at 22, and the shift control, which is generated by a pseudo-random generator, is 0, the data will occupy the bottom 3 bits. When the shift control is greater than 0, data will be shifted up by the corresponding number of positions (e.g., 2 or 6 as shown in at 24 and 26 in FIGS. 2B and 2C) and will wrap around if necessary as shown in FIG. 2C.

Figure 3:
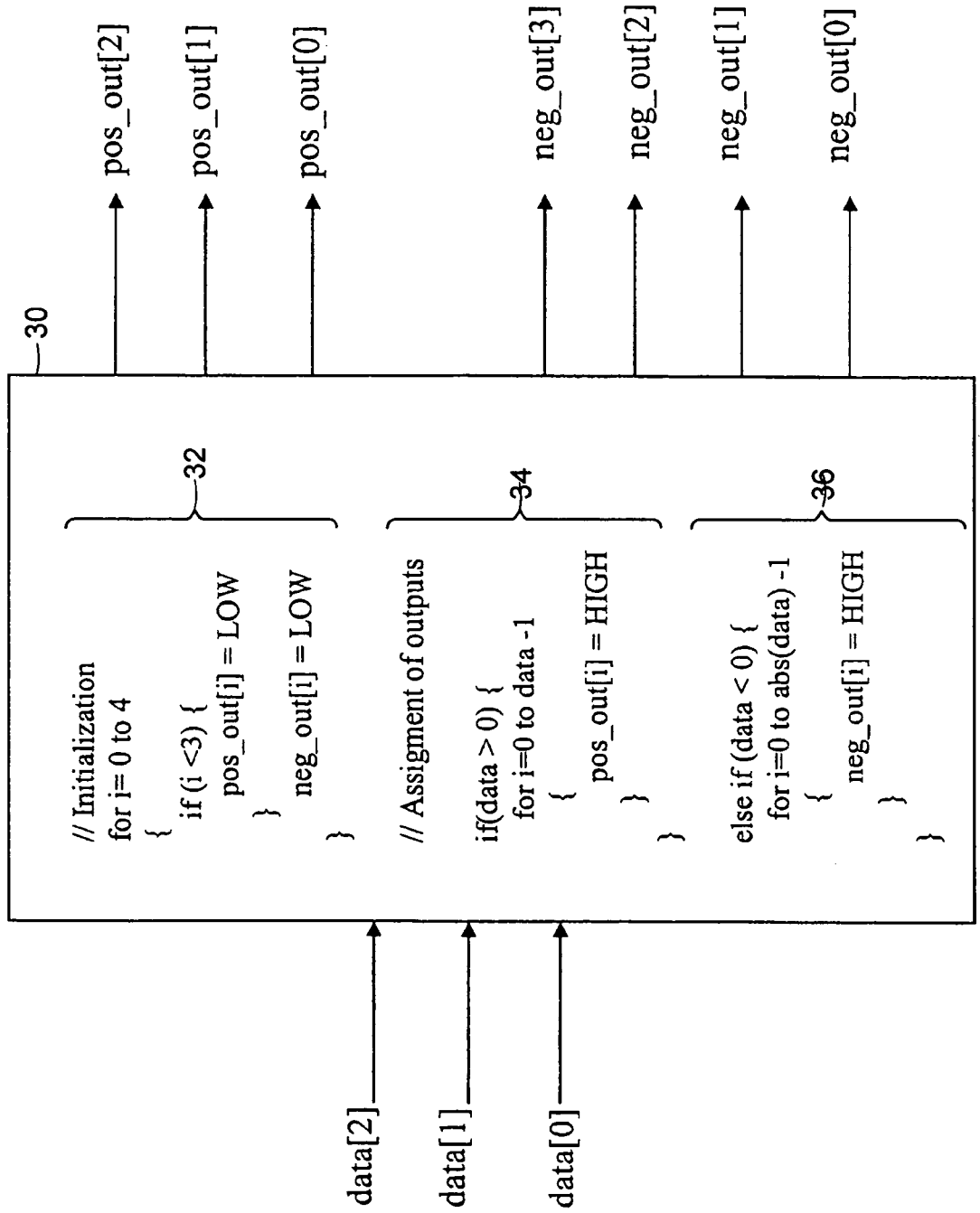
FIG. 3 shows a diagrammatic illustrative functional view of a 3-bit signed thermometer logic encoder in accordance with an embodiment of the invention.

FIG. 3 shows the 3-bit signed thermometer logic encoder 30 with a descriptive depiction of the code provided therein for illustrative purposes. The input data is signed binary data (including a sign bit data[2] and a magnitude bit data[1] as well as a zero bit data[0]), while the output data is signed thermometer data (including pos_out[0], pos_out[1], pos_out[2], neg_out[0], neg_out[1], neg_out[2] and neg_out [3]). As shown in the code at 32, both the positive outputs and negative outputs are first initialized to 0, then depending on the input data value, either the positive output bits or negative output bits are asserted 1 as shown at 34 and 36 respectively. There is never the case where both positive and negative outputs are asserted since this represents an illegal condition.

Figure 4:
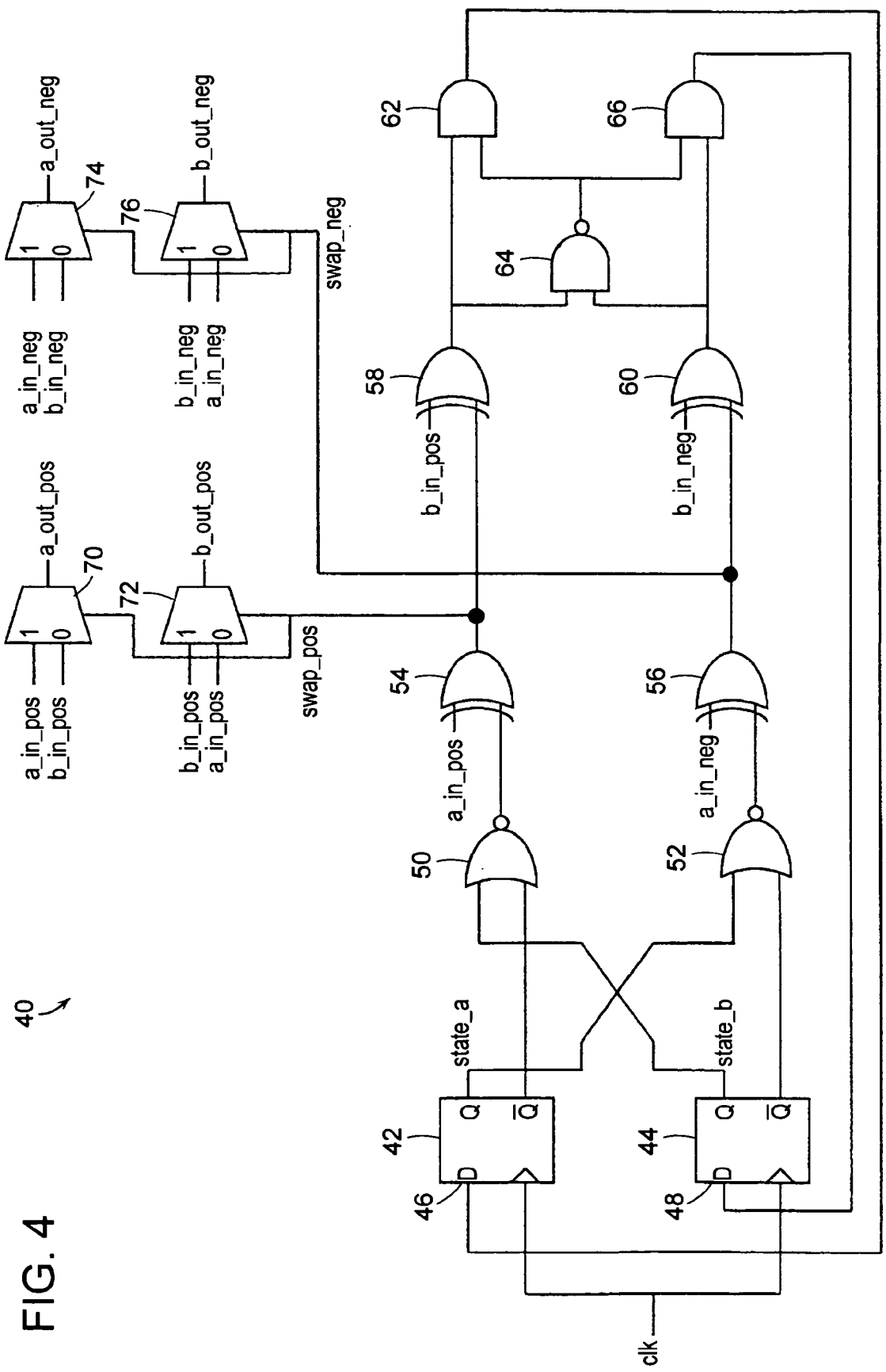
FIG. 4 shows a diagrammatic illustrative view of a tri-level logic shuffling cell in accordance with an embodiment of the invention.

FIG. 4 shows a schematic diagram of a shuffler cell 40 in accordance with an embodiment of the invention. The shuffler cell 40 includes D flip flops 42 and 44 that receive a clock input signal and current_state_a and current_state_b signals at inputs 46 and 48 respectively. The Q outputs of each of the flip flops 42 and 44 are provided to NOR gates 50 and 52 together with the $\overline{Q}$ outputs of the other respective flip flop as shown. The Q output of the flip flop 42 provides the next_state_a and the Q output of the flip flop 44 provides the next_state_b. The output of the NOR gate 50 is provided to an exclusive OR (XOR) gate 54 together with the a_in_pos_data, and the output of the NOR gate 52 is provided to an XOR gate 56 together with the a_in_neg data. The output of the XOR gate 54 is provided to an XOR gate 58 together with the b_in_pos data, and the output of the XOR gate 56 is provided to an XOR gate 60 together with the b_in_neg data. The output of the XOR gate 58 is provided to both an AND gate 62 and to a NAND gate 64. The output of the XOR gate 60 is provided to an AND gate 66 and is also provided to the NAND gate 64. The output of the NAND gate 64 is provided to inputs of both of the AND gates 62 and 66. The outputs of the AND gates 62 and 66 are provided to the D inputs 46 and 48 of the flip flops 42 and 44 respectively.

The a/b equalization for the positive and negative circuits is provided by summers 72, 74, 76 and 78. In particular, the output of the XOR gate 54 provides a swap_pos signal to clock signals of the summers 70 and 72, and the XOR gate 56 provides a swap_neg signal to the clock signals of the summers 74 and 76.

The operation of the shuffler cell 40 is as follows. On the rising edge of the clock the state variable state_a and state_b are updated. Variable state_a records which of the 2 positive outputs was used previously while state_b records which of the 2 negative outputs was used previously. Specifically, if state_a is 1, a_out_pos was used previously. Likewise, if state_b is 1, a_out_neg was used previously. When both state_a and state_b are 1s, they indicate that a_out_pos and a_out_neg were both used previously, this means that the error contributed by the element connected to a_out_pos and a_out_neg is averaged out and equal to zero.

The truth table for valid values of the logic circuit for the shuffler cell 40 of FIG. 4 is shown at 80 in FIG. 5. Although there are 64 total combinations of inputs, certain combinations are not permitted since they have both positive and negative inputs being 1s' at the same time, or state_a and state_b are both equal to 1s' at the same time. The valid input possible combinations are shown at 82 and the valid possible output combinations are shown at 84.

Figure 6:
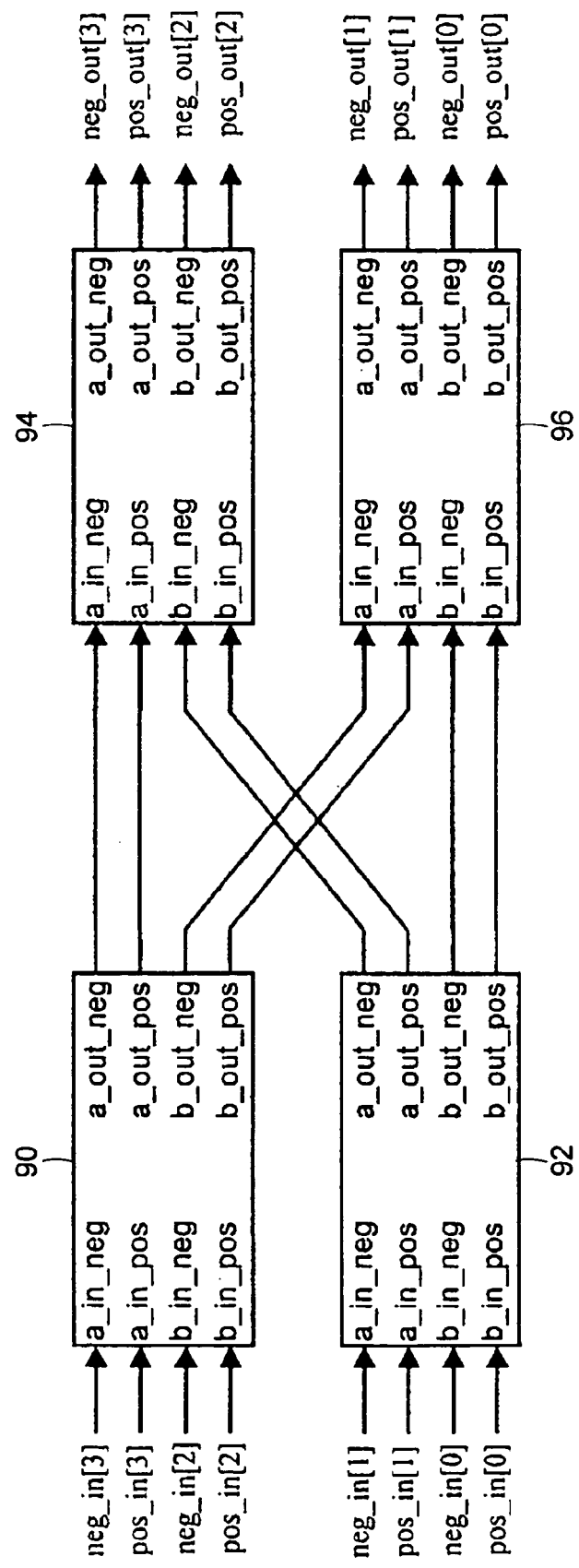
FIG. 6 shows an illustrative diagrammatic view of a 3-bit tri-level logic shuffler in accordance with an embodiment of the invention.

FIG. 6 shows a 3-bit tri-level logic shuffler that receives eight lines of input and produces eight lines of output. The cell employs a butterfly connection in which pairs of data lines are cross coupled as shown. In particular, circuit includes a swap cell 90 that receives input data neg_in[3], pos_in[3], neg_in[2] and pos_in[2]. The swap cell 92 receives input data neg_in[1], pos_in[1], neg_in[0] and pos_in[0]. The a_out_neg data and the a_out_pos data from the cell 90 are transferred directly a_in_neg and a_in_pos inputs of a cell 94, while the b_out_neg data and the b_out_pos data from the cell 90 are crossed to a_in_neg and a_in_pos inputs of a cell 96. The a_out_neg data and the a_out_pos data from the cell 90 are crossed to the b_in_neg and b_in_pos inputs of a cell 94, while the b_out_neg data and the b_out_pos data from the cell 90 are transferred directly to b_in_neg and b_in_pos inputs of cell 96.

Figure 7:
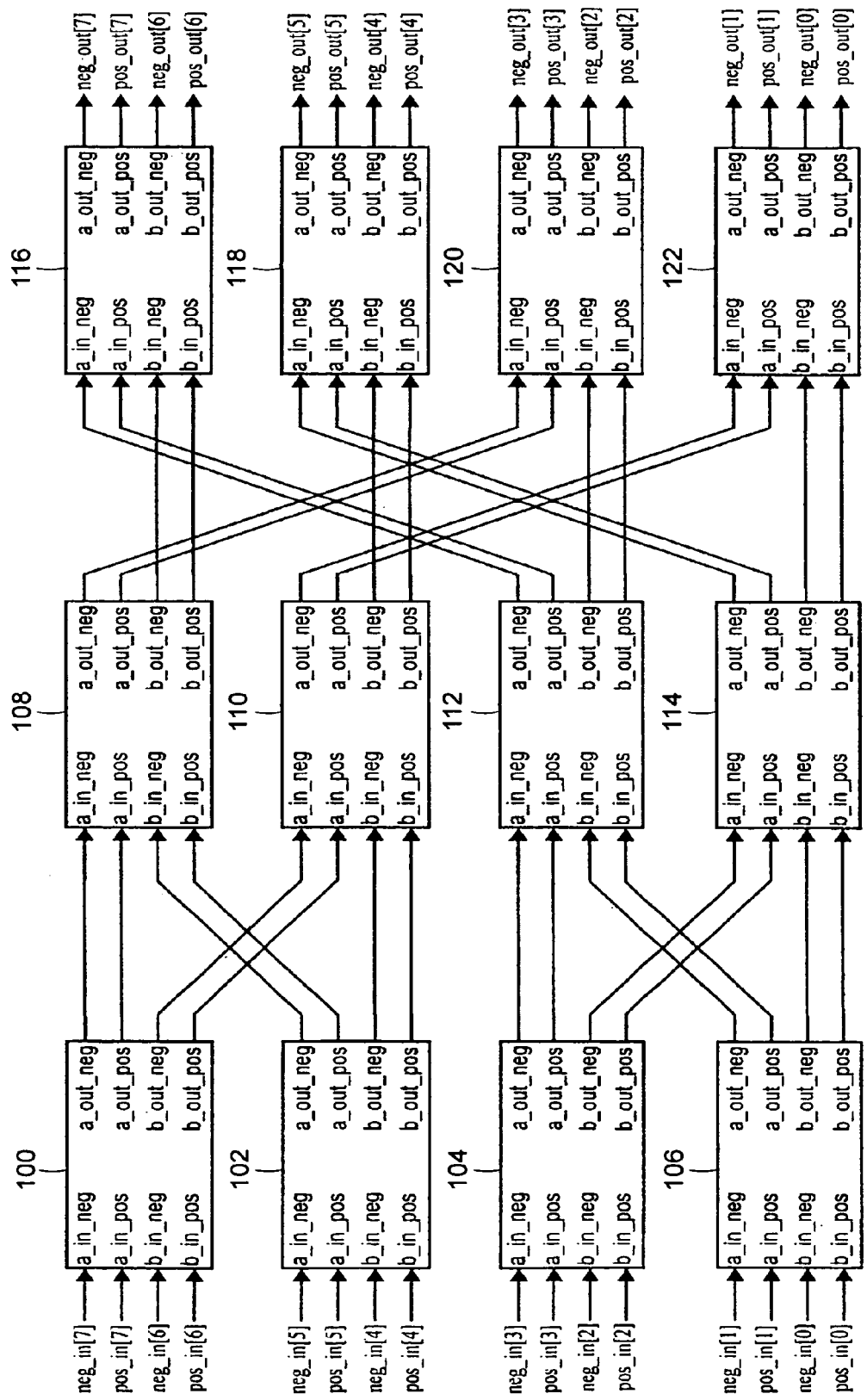
FIG. 7 shows an illustrative diagrammatic view of 4-bit tri-level logic shuffler in accordance with another embodiment of the invention.

FIG. 7 shows a 4-bit tri-level logic shuffler circuit that receives eight pairs of inputs and produces 8 pairs of outputs. The circuit includes swap cells 100, 102, 108 and 110 that function as discussed above with respect to the circuit of FIG. 6. The circuit also includes cells 104, 106, 112 and 114 that also function as discussed above with respect to FIG. 6. A second stage is also provided in the circuit of FIG. 7 in which the b_out_neg and b_out_pos data are provided directly to the cells 116, 118, 120 and 122 respectively, but the a_out_neg and a_out_pos data are crossed. In particular, the a_out_neg and a_out_pos data of the cell 108 are crossed to the a_in_neg and a_in_pos data inputs of the cell 120; the a_out_neg and a_out_pos data of the cell 110 are crossed to the a_in_neg and a_in_pos data inputs of the cell 122; the a_out_neg and a_out_pos data of the cell 112 are crossed to the a_in_neg and a_in pos_data inputs of the cell 116; and the a_out_neg and a_out_pos data of the cell 114 are crossed to the a_in_neg and a_in_pos data inputs of the cell 118. Since each shuffler has 4 outputs, it will be connected, therefore, to 2 pairs of push-pull current cells.

Figure 8:
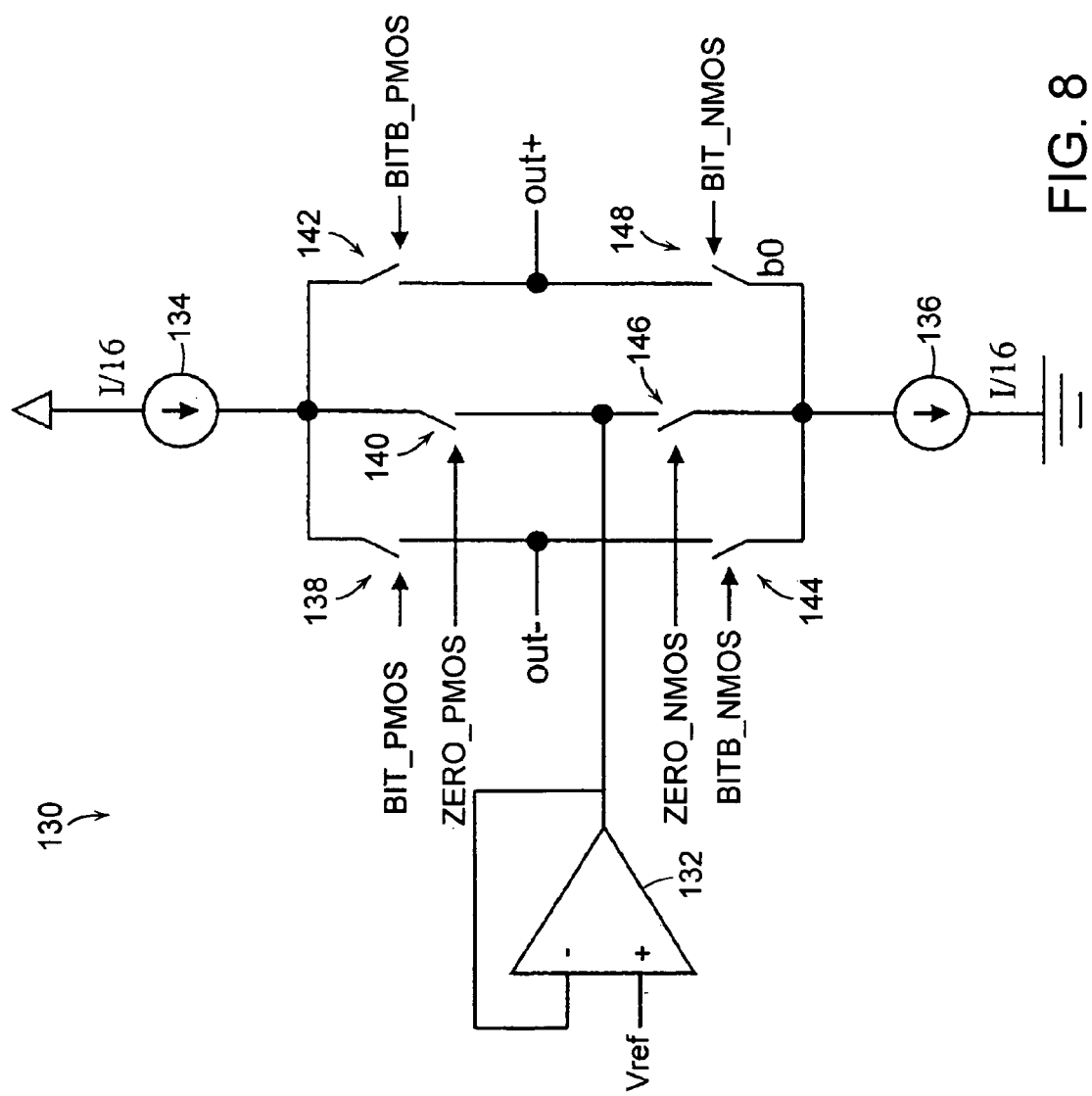
FIG. 8 shows an illustrative diagrammatic view of a DAC cell in accordance with an embodiment of the invention.

FIG. 8 shows a DAC cell 130 in accordance with an embodiment of the invention that includes an amplifier 132, a positive current source 134, a negative current source 136, and switches 138, 140, 142, 144, 146 and 148 that are employed to provide the BIT_PMOS, BITB_PMOS, BITB_NMOS and BIT_MOS outputs as shown.

Figure 9:
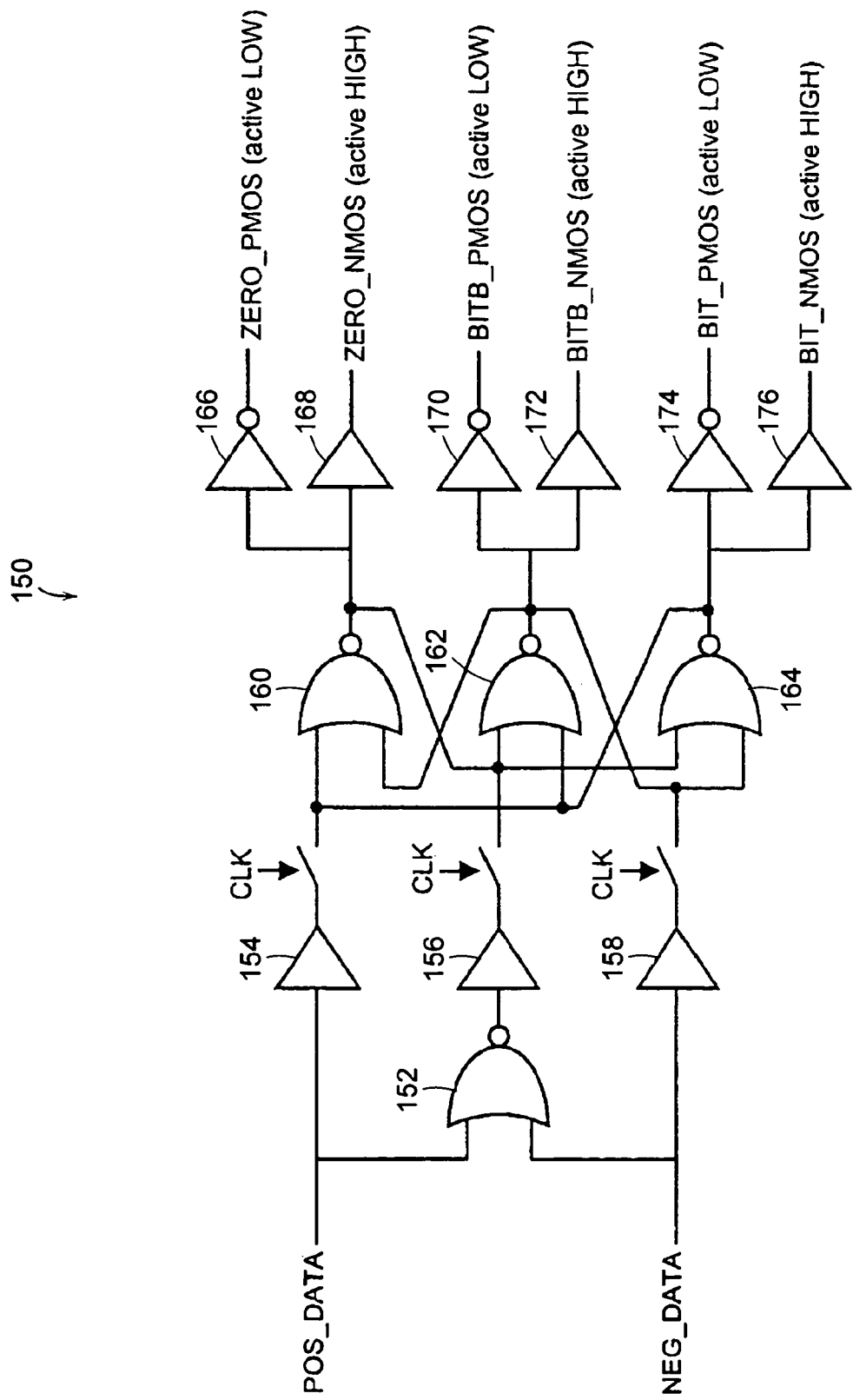
FIG. 9 shows an illustrative diagrammatic view of a NOR gate-based DAC cell driver in accordance with an embodiment of the invention.
Figure 10:
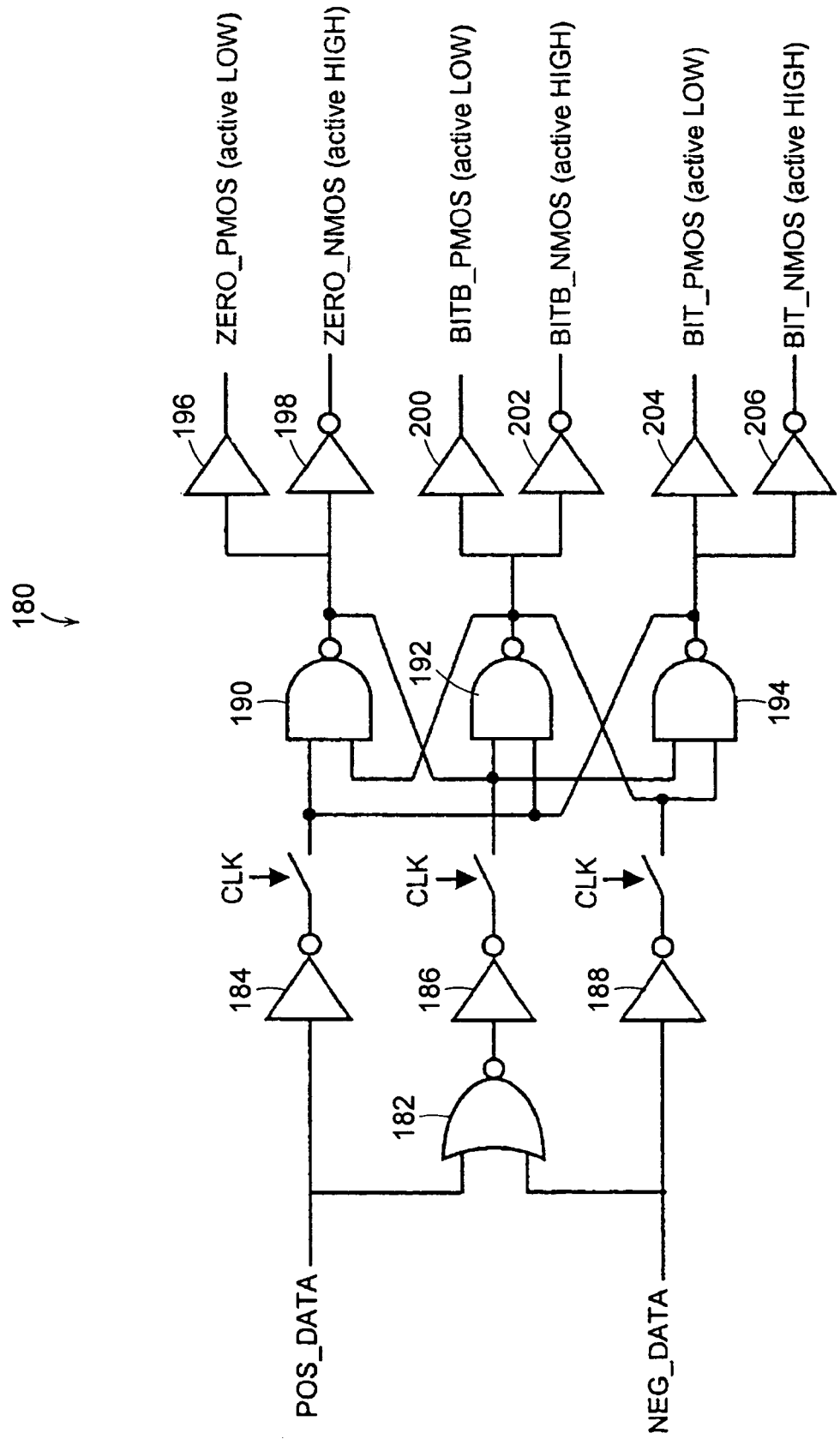
FIG. 10 shows an illustrative diagrammatic view of a NAND gate-based DAC cell driver in accordance with another embodiment of the invention.

FIG. 9 shows a DAC cell 150 in accordance with an embodiment of the invention that employs a NOR gate based design. In particular, the circuit 150 includes NOR gates 152, 160, 162 and 164, as well as buffers 154, 156, 158, 168, 172 and 176, and inverters 166, 170 and 174. FIG. 10 shows a DAC cell 180 in accordance with another embodiment of the invention that employs a NAND gate based design. In particular the circuit 180 includes a NOR gate 182 and NAND gates 190, 192 and 194, as well as buffers 184, 186, 188, 196, 200, 204, as well as inverters 198, 202 and 206.

Figure 11:
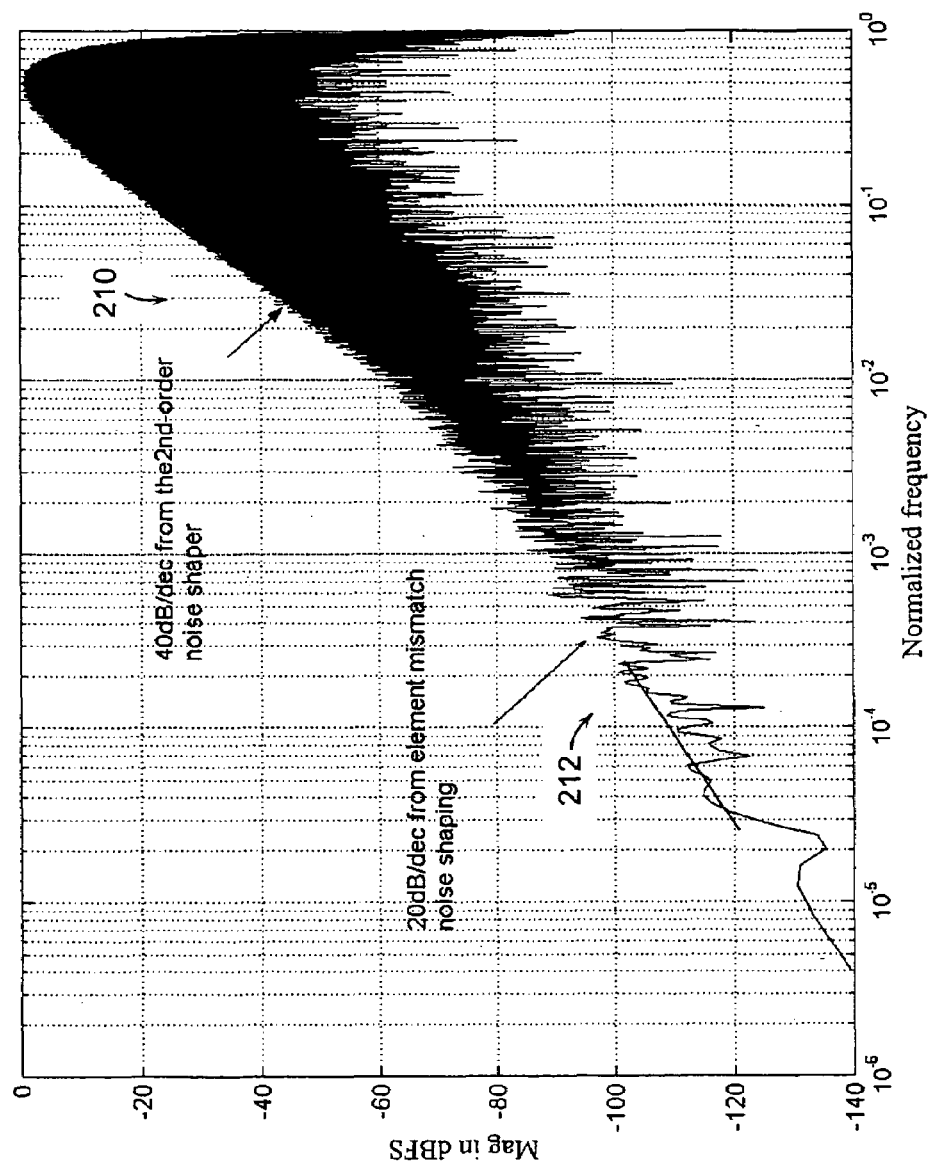
FIG. 11 shows an illustrative diagrammatic graphical representation of a simulation for a 4-bit $2^{nd}$ order DAC with 0.5% element mismatch.
Figure 12:
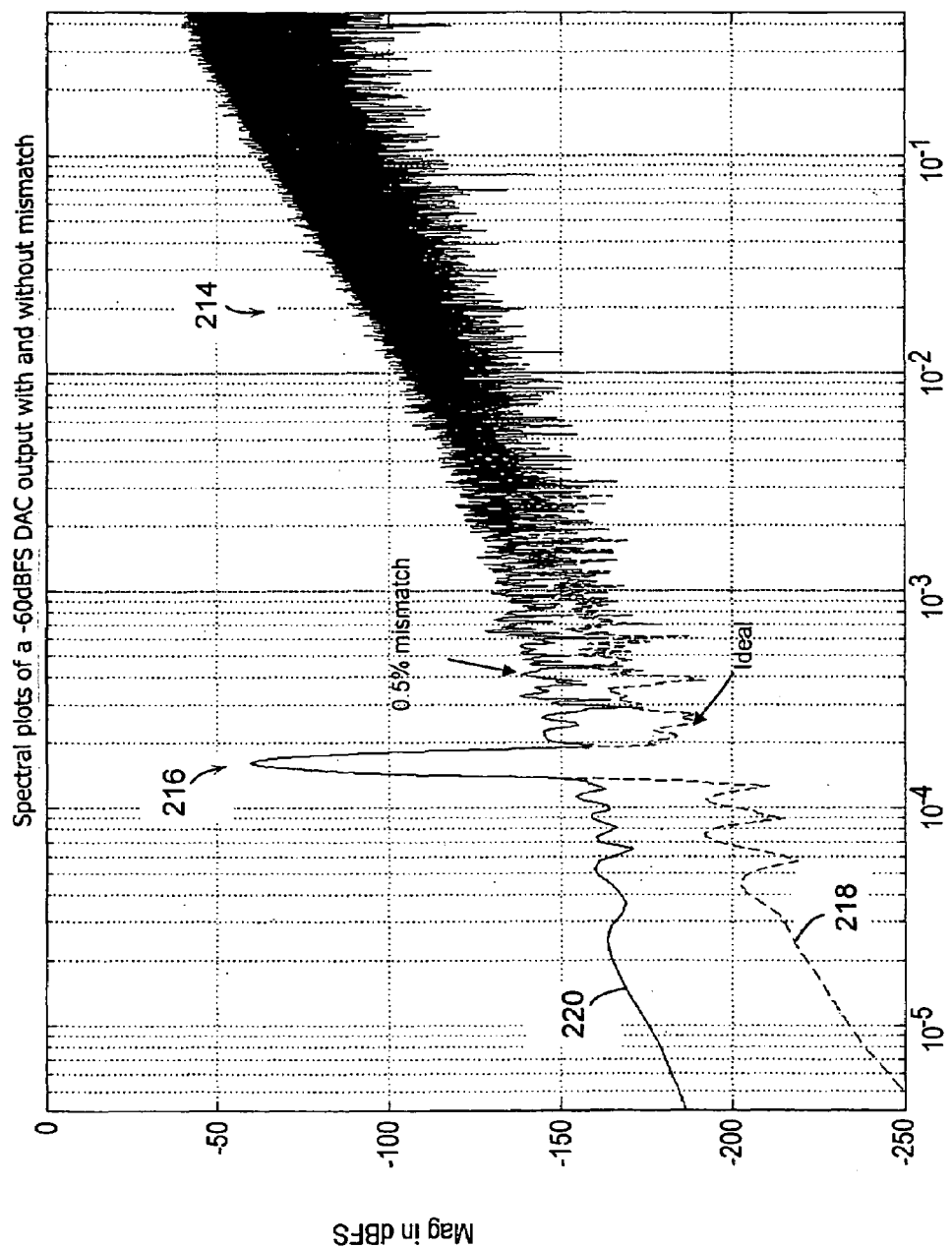
FIG. 12 shows an illustrative diagrammatic graphical representation of the simulation of FIG. 11 with a −60 dBFS input.

FIG. 11 shows spectral plot of the output of a $2^{nd}$-order, 4-bit DAC in accordance with a tri-level logic data-directed shuffler of an embodiment of the invention. The DAC has 16 unit elements that have a mismatch error of 0.5% rms. FIG. 11 shows the 40 dB/dec from the $2^{nd}$ order noise shaper at 210 and the 20 dB/dec from element mismatch noise shaping at 212. FIG. 12 shows a −60 dBFS output of the same converter. In particular, FIG. 12 shows the −100 to −50 dBFS at 214 with a peak shown at 216, with the simulation results with element mismatch shown at 220 and the ideal results without element mismatch shown at 218. Both FIGS. 11 and 12 show the noise shaping effect of the shuffler as a 20 dB/dec slope of the spectral plots.

In various embodiments, therefore, the invention provides a method of generating a signed thermometer data output from a signed binary data input in which the method includes the step of generating two thermometer data outputs; one responding to positive input data and one responding to negative input data. In further embodiments, the invention provides a method of pre-randomizing the positive and negative thermometer data groups, and may further include the steps of generating a pseudo-random number; and using the pseudo-random number to control two barrel shifters to shift the position of the thermometer data words within the barrel shifters.

In accordance with a further embodiment, the invention provides a method of grouping signed thermometer data before they enter a shuffler that includes the steps of paring the positive thermometer data into groups of two; and pairing the negative thermometer data into groups of two.

In accordance with another embodiment, the invention provides a method of shuffling signed thermometer data that includes the steps of generating a shuffler cell; generating the state variables, and a swap control signal within said shuffler cell based on the previous state variables and the current inputs; connecting the inputs of the shuffler cell directly to the outputs; or swapping the inputs before connecting them to the outputs according to the value of the swap control signal.

In accordance with another embodiment, the invention provides a signed thermometer data shuffler cell that includes a pair of positive thermometer data inputs, a pair of negative thermometer data inputs, a pair of positive thermometer data outputs, a pair of negative thermometer data outputs, and a clock signal and a reset signal.

In accordance with another embodiment, the invention further provides that the positive output pair of the previous shuffler cell may be connected to the positive input pair of the following shuffler cell; and that the negative output pair of the previous shuffler cell may be connected to the negative input pair of the following shuffler cell; wherein both connections follow the butterfly-style connection discussed above.

In accordance with another embodiment, the invention provides a method of decoding the output of the shuffler that includes the steps of generating a new control signal from the positive and negative inputs where the control signal is asserted when both inputs are low; connecting the control signal to a pair of switches; connecting the positive input to a pair of switch; and connecting the negative input to a pair of switches.

In accordance with yet another embodiment, the invention provides a method of holding the drain voltage of the current sources at a known level that includes the step of connecting the current sources to a reference voltage buffer output when the input control signals are both zero.

Those skilled in the art will appreciate that numerous variations and modifications may be made to the above disclosed embodiments without departing from the spirit and scope of the invention.

What is claimed is:

1. A system for processing digital signals in a data converter, said system comprising:
   a thermometer encoder for receiving signed binary data and for providing signed thermometer data, said signed thermometer data including positive thermometer data and negative thermometer data;
   a shuffler that receives positive input data responsive to the positive thermometer data and that receives negative input data responsive to the negative thermometer data;
   a decoder for receiving output data from the shuffler and providing decoded data to an analog output stage; and
   a positive data barrel shifter interposed between the thermometer encoder and the shuffler, and a negative barrel shifter interposed between the thermometer encoder and the shuffler.

2. The system as claimed in claim 1, wherein said thermometer encoder includes a first positive output data node for providing positive thermometer data and a negative output node for providing negative.

3. The system as claimed in claim 1, wherein said shuffler includes a plurality of shuffler cells, each of which receives two pairs of inputs and provides two pairs of outputs, wherein one of said pairs of outputs is coupled to a second shuffler cell while a second of said pairs of outputs is coupled to a third shuffler cell.

4. The system as claimed in claim 3, wherein said shuffler receives four pairs of data inputs and provides four pairs of data outputs.

5. The system as claimed in claim 3, wherein each said shuffler cell includes a pair of positive thermometer data inputs, a pair of negative thermometer data inputs, a pair of positive thermometer data outputs, a pair of negative thermometer data outputs, a clock signal and a reset signal.

6. The system as claimed in claim 1, wherein said analog output stage includes a tri-level logic output driver that provides a positive output, a negative output and a zero output.

7. The system as claimed in claim 6, wherein each said shuffler cell includes flip flops.

8. A system for processing digital signals in a data converter, said system comprising:
   a thermometer encoder for receiving signed binary data and for providing signed thermometer data;
   a shuffler that receives said signed thermometer data and provides tri-level logic output including positive state output, negative state output and zero state output;
   a decoder for receiving output data from the shuffler and providing decoded data to an analog output stage; and
   a positive data barrel shifter interposed between the thermometer encoder and the shuffler, and a negative barrel shifter interposed between the thermometer encoder and the shifter.

9. The system as claimed in claim 8, wherein said signed thermometer data includes positive thermometer data and negative thermometer data.

10. The system as claimed in claim 8, wherein said shuffler includes a plurality of shuffler cells, each of which receives two pairs of inputs and provides two pairs of outputs, wherein one of said pairs of outputs is coupled to a second shuffler cell while a second of said pairs of outputs is coupled to a third shuffler cell.

11. The system as claimed in claim 10, wherein said shuffler receives four pairs of data inputs and provides four pairs of data outputs.

12. The system as claimed in claim 10, wherein each said shuffler cell includes a pair of positive thermometer data inputs, a pair of negative thermometer data inputs, a pair of positive thermometer data outputs, a pair of negative thermometer data outputs, a clock signal and a reset signal.

13. The system as claimed in claim 8, wherein said shuffler provides that current sources are coupled to a reference voltage when said zero state output is provided by the shuffler.

14. A method of processing digital signals in a data converter, said method comprising the steps of:
   receiving signed binary data at a thermometer encoder;
   providing signed thermometer data;
   receiving said signed thermometer data at a shuffler;
   providing tri-level logic output including positive state output, negative state output and zero state output, when current sources are coupled to a reference voltage;
   receiving output data from the shuffler at a decoder; and
   providing decoded data to an analog output stage.

* * * * *